(12) United States Patent
Aboujja et al.

(10) Patent No.: US 11,152,767 B1
(45) Date of Patent: Oct. 19, 2021

(54) ALINGAAS/INGAASP/INP EDGE EMITTING SEMICONDUCTOR LASER INCLUDING MULTIPLE MONOLITHIC LASER DIODES

(71) Applicant: SemiNeX Corporation, Peabody, MA (US)

(72) Inventors: Sidi Aboujja, Lynnfield, MA (US); David M. Bean, Middleton, MA (US)

(73) Assignee: Seminex Corporation, Peabody, MA (US)

(*) Notice: Subject to any disclaimer, the term of this patent is extended or adjusted under 35 U.S.C. 154(b) by 44 days.

(21) Appl. No.: 16/889,963

(22) Filed: Jun. 2, 2020

(51) Int. Cl.
| | |
|---|---|
| *H01S 5/00* | (2006.01) |
| *H01S 5/40* | (2006.01) |
| *H01S 5/343* | (2006.01) |
| *H01S 5/30* | (2006.01) |
| *H01S 5/026* | (2006.01) |
| *H01S 5/34* | (2006.01) |
| *H01S 5/024* | (2006.01) |
| *H01S 5/0234* | (2021.01) |
| *H01S 5/0237* | (2021.01) |

(52) U.S. Cl.
CPC .......... *H01S 5/4043* (2013.01); *H01S 5/026* (2013.01); *H01S 5/3054* (2013.01); *H01S 5/3095* (2013.01); *H01S 5/3409* (2013.01); *H01S 5/3416* (2013.01); *H01S 5/3434* (2013.01); *H01S 5/34306* (2013.01); *H01S 5/34313* (2013.01); *H01S 5/0234* (2021.01); *H01S 5/0237* (2021.01); *H01S 5/02469* (2013.01); *H01S 5/34366* (2013.01)

(58) Field of Classification Search
CPC ...... H01S 5/4043; H01S 5/026; H01S 5/3054; H01S 5/3095; H01S 5/3409; H01S 5/3416; H01S 5/34306; H01S 5/34313; H01S 5/3434; H01S 5/0234; H01S 5/0237; H01S 5/02469; H01S 5/34366
See application file for complete search history.

(56) References Cited

U.S. PATENT DOCUMENTS

| | | | | |
|---|---|---|---|---|
| 5,212,706 | A * | 5/1993 | Jain .................. | B82Y 20/00 372/23 |
| 6,052,398 | A * | 4/2000 | Brillouet ............ | H01S 5/18305 372/46.01 |
| 6,760,357 | B1 * | 7/2004 | Boucart ............. | H01S 5/426 257/104 |
| 8,063,408 | B2 * | 11/2011 | Murata .............. | H01S 5/0265 257/94 |
| 2004/0161013 | A1 * | 8/2004 | Bour ................. | H01S 5/18358 372/96 |
| 2005/0083979 | A1 * | 4/2005 | Leary ................ | B82Y 20/00 372/43.01 |
| 2021/0111539 | A1 * | 4/2021 | Siala ................. | H01S 5/22 |

* cited by examiner

*Primary Examiner* — Kinam Park
(74) *Attorney, Agent, or Firm* — HoustonHogle LLP

(57) ABSTRACT

A monolithic edge emitting semiconductor laser comprising multiple laser diodes using aluminum indium gallium arsenide phosphide AlInGaAs/InGaAsP/InP material system, emitting in long wavelengths (1250 nm to 1720 nm). Each laser diode contains an active region comprising aluminium indium gallium arsenide quantum wells (AlInGaAs QW) and aluminium indium gallium arsenide (AlInGaAs) barriers and connected to the subsequent monolithic laser diode by highly doped, low bandgap and low resistive indium gallium arsenide junction called tunnel junction.

25 Claims, 4 Drawing Sheets

ALINGAAS/INGAASP/INP EDGE EMITTING SEMICONDUCTOR LASER INCLUDING MULTIPLE MONOLITHIC LASER DIODES

BACKGROUND OF THE INVENTION

LiDAR (Light Detection and Ranging) is a technology that senses the distances using laser emissions. LIDAR measures the time difference between emission of a signal from a laser and its return to a detector, after reflection from an object. Typically, multiple monolithic lasers are used in pulsed condition, the lasers and the detector are close to each other. The laser pulse is emitted, and a part of the pulse is reflected back from the object and collected by the detector. The time difference between the pulse emission and its return to the detector is calculated. The distance is calculated based on this information. Three (3) dimension images are generated by sensing and measuring different distances in a specific field of view. The generated images are processed and used in automotive applications such as autonomous driving and adaptive cruise controls systems, for example.

Previously, near infrared lasers operating in the range of 905 nanometer (nm) using gallium arsenide GaAs and aluminum gallium arsenide AlGaAs and indium gallium arsenide InGaAs materials, have been used for LIDAR systems. These laser material systems show high efficiency, 1 Watt per Ampere (W/A), for a single monolithic laser. The high power 905 nm lasers are not eye safe, however, and can damage the retina.

To increase the output power in edge-emitting laser diodes, many manufactures stack two, three, four or more laser diodes one on top of the other using solder bonding to connect lasers together. The output power of stacked-solder-bonded laser diodes is almost two (2) times the single laser diode output power in two laser diodes stack configuration and three (3) times the single laser output power in three laser diodes stack configuration. The voltage drop across the stacked lasers is also doubled if two laser diodes are stacked and tripled if three laser diodes are stacked together. The 2-stacked laser diode optical output size diameter is generally equal to a single laser chip thickness plus the bond line thickness. The 3-stacked laser diode optical output size diameter is equal to the thickness of 2 laser diodes plus the thickness of two bond lines.

SUMMARY OF THE INVENTION

On the other hand, long wavelength (wavelength >1300 nm) single monolithic laser efficiency is typically only about half of the efficiency of the 905 nm lasers efficiency. At the same time, stacked-solder-bonded laser diodes is not suitable some applications. For laser fiber coupling and long range applications such as LIDAR it is difficult to accurately focus the separated outputs from the multiple laser diodes.

In general, the present invention often concerns long-wavelength, high-power lasers operating in eye safe region, with wavelengths higher than 1300 nm. Multiple monolithic lasers are employed to achieve a high-power laser.

Such lasers have many uses. These include military range finding applications, for military IFF (Identification Friend or Foe) and for missile defense systems. These eye safe lasers can also be used for many other applications such automotive LIDAR and adaptive cruise control (ACC) application. In addition, these eye safe high power lasers can also find application in industrial environments such as vision controls and machine controls.

The present invention can be applied to multiple monolithic long wavelength lasers that can achieve higher efficiency approaching 1 W/A and remain eye safe and this is suitable for long range LIDAR applications. Often, these multiple monolithic lasers are used in pulse condition application between 1 nanosecond (ns) and 150 ns.

In general, according to one aspect, the invention features an edge emitting semiconductor laser containing multiple monolithic laser diodes, using aluminum indium gallium arsenide phosphide AlInGaAs/InGaAsP/InP material system, emitting in long wavelengths (1250 nm to 1720 nm), wherein the monolithic laser diodes are connected one to another by one or more tunnel junctions and each monolithic laser diode comprises an active region with barriers and no more than three quantum wells constructed from various ratios of aluminum, gallium, indium and arsenic.

In embodiments, the Aluminum Indium gallium Arsenide quantum wells are sized between 5 nm and 10 nm, wherein the active region is placed between two confining layers of opposite conductive doping where p-doped confining layers start with a concentration of 5e16 cm-3 −25%/+50% and increase to a final concentration of 1e17 cm-3, −25%+50%, and an interface layer that immediately follows the p-doped confining layers has a fixed doping concentration which is between the final doping concentration of the confining layers and 1e18 cm-3, +300%.

Preferably, an InP substrate and cladding layers in each monolithic laser diode with doping concentrations between 1e17 cm-3 and 6e17 cm-3 is used. Also, the p-doped cladding layer of each monolithic laser diode can be doped with zinc.

Currently, each monolithic laser diode comprises an aluminum indium arsenide layer between the active region and at least one of the cladding layers. In addition, the doping of the aluminum indium arsenide layer in each monolithic laser diode can be zinc and its concentration can be equal or less than 1e18 cm-3.

The number of the monolithic laser diodes can be two, three or four and each monolithic laser diode contains graded index confining layers. Also, a P-type aluminum indium gallium arsenide waveguide layer is sometimes equal or less than 1e17 cm-3, in one or two or all monolithic laser diodes. In addition, the P-type aluminum indium gallium arsenide cladding layer can be doped to a concentration that is equal or less than 1e18 cm-3 for one, two or all monolithic laser diodes. The N-type aluminum indium gallium arsenide waveguide layer might be doped to a concentration that is equal or less than 1e17 cm-3 for one, two or all monolithic laser diodes. Also, the N-type aluminum indium gallium arsenide cladding layers doping can be equal or less than 5e17 cm-3, in one, two or all monolithic laser diodes.

A ridge waveguide structure can be used on the top monolithic laser that supports multiple spatial modes in each monolithic laser diode. Also a groove might be etched from the top p-type indium gallium arsenide contact layer through the active area. In addition, the depth of the groove might be between 2 micrometers and 10 micrometer and walls forming the groove are tilted at an angle between 45 degrees and 80 degrees.

The aperture width can be between 2 and 350 micrometers and the cavity length is between 0.5 mm and 4 mm.

Currently, it emits light in the spectral range of 1250 micrometers and 1720 micrometers.

In general, according to another aspect, the invention features an edge emitting semiconductor laser grown on indium phosphide substrate containing multiple monolithic laser diodes, in which the monolithic laser diodes are connected to each other with a tunnel junction, wherein each monolithic laser diode comprises an active region with barriers and quantum wells constructed from various ratios of aluminum, gallium, indium and arsenic wherein the quantum well structures of the multiple active areas differ from one to another in terms of their layer thicknesses and/or their material compositions such that at least two emission areas have different emission wavelengths by at least 5 nm.

In general, according to another aspect, the invention features an edge emitting semiconductor laser grown on indium phosphide substrate containing multiple monolithic laser diodes, in which the monolithic laser diodes are connected to each other with a tunnel junction, wherein each monolithic laser diode comprises an active region with barriers and quantum wells constructed from various ratios of aluminum, gallium, indium and arsenic wherein the quantum well structures of the multiple active areas are the same or differ from one to another in terms of their layer thicknesses and/or their material compositions such that all emission areas have the same emission wavelengths within 5 nm.

The photoluminescence emission difference between one monolithic laser diode to another is often one is less than 5 nm. Also, each monolithic laser diode compromises aluminum indium gallium arsenide barriers with thicknesses between 5 nanometers and 10 nanometers in many examples. The monolithic laser diodes preferably connected to one another by tunnel junctions and the tunnel junctions have a thickness of 50 nm or less.

The tunnel junction often comprises two indium gallium arsenide layers, P-type and N-type. The tunnel junction P-type indium gallium arsenide layer might be doped with Carbon or Zinc with doping concentration higher than 5e18 cm-3 and less than 1e20 cm-3. The tunnel junction N-type indium gallium arsenide layer can be doped with Silicon or Tellerium with doping concentration higher than 5e18 cm-3 and less than 1e20 cm-3. The tunnel junction P-type indium gallium arsenide layer thickness is sometimes less than 50 nm and N-type indium gallium arsenide layer thickness is sometimes less than 50 nm.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

The invention now will be described more fully hereinafter with reference to the accompanying drawings, in which illustrative embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

As used herein, the term "and/or" includes any and all combinations of one or more of the associated listed items. Further, the singular forms and the articles "a", "an" and "the" are intended to include the plural forms as well, unless expressly stated otherwise. It will be further understood that the terms: includes, comprises, including and/or comprising, when used in this specification, specify the presence of stated features, integers, steps, operations, elements, and/or components, but do not preclude the presence or addition of one or more other features, integers, steps, operations, elements, components, and/or groups thereof. Further, it will be understood that when an element, including component or subsystem, is referred to and/or shown as being connected or coupled to another element, it can be directly connected or coupled to the other element or intervening elements may be present.

It will be understood that although terms such as "first" and "second" are used herein to describe various elements, these elements should not be limited by these terms. These terms are only used to distinguish one element from another element. Thus, an element discussed below could be termed a second element, and similarly, a second element may be termed a first element without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In general, many embodiments employ a monolithic laser diode structure to reduce the laser diode optical source size and to increase the output power. This is achieved by epitaxially depositing multiple laser diodes are one on top of the other to yield a monolithic structure. The diodes are connected with thin and low resistive junctions called tunnel junctions.

Figure 1:
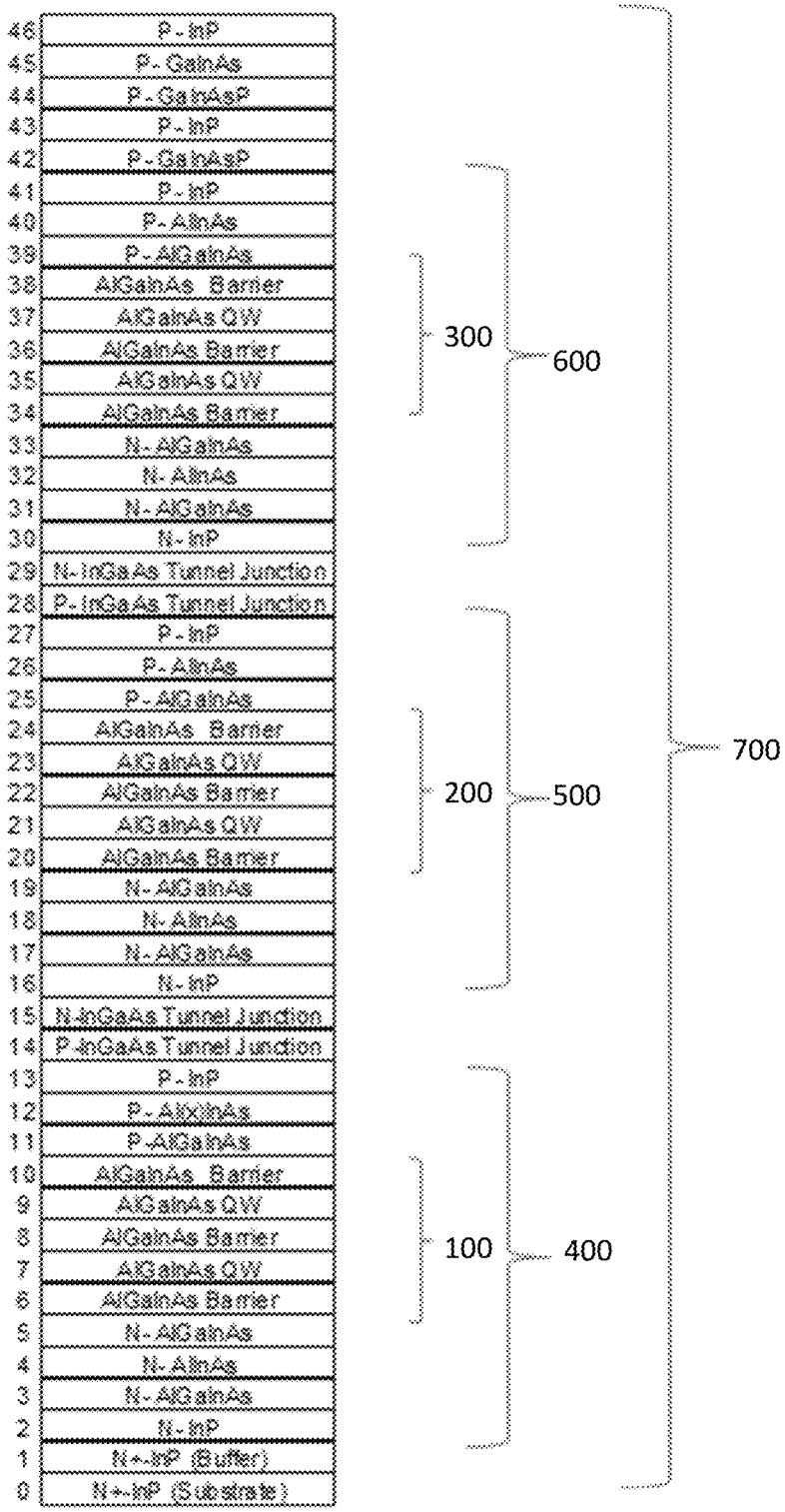
FIG. 1 is schematic side cross sectional view showing the epitaxial layer structure according to the present invention of a multiple monolithic laser diode structure.
Figure 2:
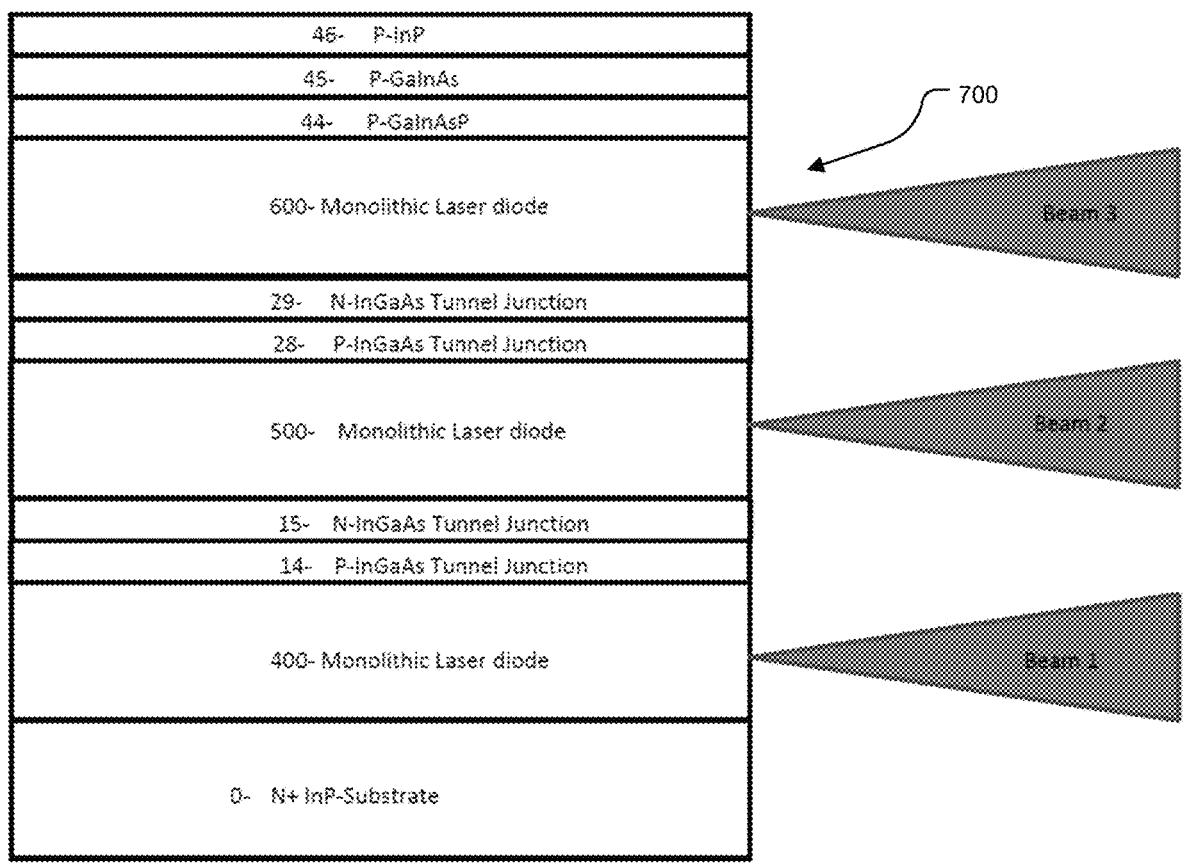
FIG. 2 is schematic lateral cross sectional view showing the structure of the inventive semiconductor device with three laser diodes connected by two tunnel junctions.

FIG. 1 shows the epitaxial layer structure for multiple (triple) monolithic laser diode structure 700 which has been constructed according to the principles of the present invention. The side view of FIG. 2 shows how each laser diode of the monolithic laser diode structure produces its own beam, Beam 1, Beam 2, Beam 3.

In more detail, three monolithic laser diodes 400, 500, 600 are be stacked, epitaxially together in the illustrated embodiment. However, in other examples, two or more than three laser diodes are stacked.

The thickness of multiple monolithic laser diode structure 700 is slightly thicker than a single laser diode. In addition, the voltage drop in a multiple monolithic laser diode structure 700 is higher than single laser diode by more than 10 times in some cases. Specifically, the voltage drop is more than two times the single diode voltage for the double monolithic laser diode structure. The voltage drop is more than three times the single laser voltage for the triple monolithic laser diode structure.

In addition, the temperature in the active areas 100, 200, 300 of the respective laser diodes 400, 500, 600 of the multiple monolithic laser diode structure 700 is higher compared to the active area of a single laser diode because of the higher voltage and higher thickness. In general, stacking epitaxially multiple laser diodes is an issue due to high voltage and thickness, which increase optical and electrical losses causing the laser to heat up, reduce optical performance, and reduce reliability.

In the illustrated example, the monolithic laser diodes 400, 500, 600 are connected one to another by respective tunnel junctions. Each tunnel junctions is formed from an n-type InGaAs layer and a p-type InGaAS layer. Specifically, a first tunnel junction is located between the bottom laser diode 400 and the subsequent monolithic laser diode 500 and comprises an p-type InGaAs layer 14 and a n-type InGaAS layer 15. A second tunnel junction is located between the middle laser diode 500 and the top monolithic laser diode 600 and comprises an p-type InGaAs layer 28 and a n-type InGaAS layer 29.

If higher power is required, the monolithic laser diode structure 700 can have a greater number of laser diodes, more than three.

As illustrated in FIG. 1, each monolithic laser diodes contains an active area 100, 200, 300. The active area 100 of the first laser diode 400 comprises a first AlGaInAs barrier layer 6, a first AlGaInAs quantum well 7, a middle AlGaInAs barrier 8, a second AlGaInAs quantum well 8, and a second AlGaInAs barrier 9. In a similar vein, the active area 200 of the second laser diode 500 comprises a first AlGaInAs barrier layer 20, a first AlGaInAs quantum well 21, a middle AlGaInAs barrier 22, an AlGaInAs quantum well 23, and an second AlGaInAs barrier 24. Finally, the active area 300 of the third laser diode 600 comprises a first AlGaInAs barrier layer 34, a first AlGaInAs quantum well 34, a middle AlGaInAs barrier 36, a second AlGaInAs quantum well 37, and a second AlGaInAs barrier 38.

The active areas 100, 200, 300 are located between waveguide layers and inner and outer cladding layers. In general, the inner cladding layers have smaller thickness than the outer cladding layers.

In addition, the active areas 100, 200, 300 of the laser diodes 400, 500, 600 will contain a single or multiple quantum well structure. Quantum well material composition and layer thicknesses are currently selected based on the desired semiconductor laser emission wavelength between 1250 nm and 1720 nm.

In many embodiments, it is important that the laser diodes 400, 500, 600 emit at the same wavelength. Many applications need center wavelength emission of the multiple laser to be within 10 nm of each other during operation, and preferably within 5 nm during operation and ideally within 1 nm or less.

The emission wavelengths can be measured by operating the multiple monolithic laser diode 10 at room temperature of some heating or cooling of the laser and measuring the emission wavelength. An alternative way to measure wavelength is to measure by photoluminescence emission which is done at the epitaxial wafer level or measurement of a laser diode emitter preferably with the metallization removed. To achieve wavelengths that operate at these closely space or the same wavelengths is difficult because each monolithic laser diode 400, 500, 600 will naturally operate at a different temperature due to how deep it is in the structure 700 and how much heating is transmitted by neighboring lasers. In other words, deeper emitters are further from the cooling side of the structure and run hotter. In addition, emitter sandwiched between other emitters are heated by their neighboring emitters and run much hotter.

In general, heating of laser diodes 400, 500, 600 shifts the operating wavelength higher, and thus if each laser diode 400, 500, 600 is running at a different temperature, then they will shift differently to higher temperatures.

To achieve close operating wavelengths for each of multiple laser diode (400, 500, 600) in the common semiconductor, the composition and thicknesses of each laser diode (400, 500, 600) should be different enough to compensate for the wavelength shift due to heat. The cold, or unheated, wavelength of each emitter can be measured using photoluminescence (PL) measurements where the wavelength is measure without inducing heat into the emitter. To compensate for the operating the PL measurement of emitters can differ by as little at 1 nm and as much as 10 nm.

In addition, the p-doping is zinc in a current embodiment. Zinc diffusion in the active areas of one, two or three monolithic active areas shift the wavelength to a higher values and this is measured at photoluminescence. In order to have all 2 or 3 monolithic lasers emitting at the same wavelength, it is required to compensate for the wavelength by changing the thickness and/or material composition of the active areas.

Specifically, the quantum well thickness and quantum well material composition differ from one monolithic laser to another in the multiple monolithic laser diodes 400, 500 and 600 in order to achieve different emission wavelengths. In some embodiments, it is preferable to have different emission wavelengths of 5 nm or greater between the different monolithic diodes. In some other embodiments, it is preferable to have emission wavelengths close together or the same within 5 nm or less between the different monolithic diodes.

The wavelength emissions difference between active areas 100, 200, 300 caused by different temperatures of the active areas 100, 200, 300 of the monolithic laser diodes 400, 500, 600 are reduced by material composition compensation.

The composition and thickness of quantum wells is adjusted the emission at the same wavelength or at different wavelength from one active area to another one of the active areas 100, 200 or 300. This could be measured using X-ray diffraction characterization at epitaxial wafer level.

In addition, n-doped indium phosphide substrate layer n+ InP 0 is an electrically conductive InP substrate. A p type GaInAs layer 45 is grown at the end of the epitaxial layers growth to make the P-ohmic contact layer.

The first layer 0 grown on the substrate is follows by a n+ InP buffer layer 1, which is used to grow the epitaxial growth of the multiple monolithic laser diode 700 including the monolithic laser diodes 400, 500, 500. The buffer layer thickness is approximately 1 micron.

Each Multiple monolithic laser active areas 100, 200, 300 is positioned within the center of an optical confinement layer of either the step index type or the graded index type separate confinement heterostructure (GRIN-SCH). An InP layer on each side of each active area 100, 200, 300 forms the optical cladding layer for the optical confinement structure and the multiquantum well (MQW) active layers. Lateral optical confinement is provided for by either a buried heterostructure or a ridge waveguide structure.

The device is operated by a vertical current injection type. Lateral current confinement is achieved by either buried stripe geometry, or a ridge waveguide of raised ridge or dual trench formation. An alternative combination is implant isolation, or mesa isolation, whereby oxide depositions confine the current to the central region of the lateral optical confinement structure.

Here, the general objective is to provide a monolithic semiconductor laser diode structure emitting multiple beams in long wavelength range (1250 nm-1720 nm). The multiple monolithic laser diodes are connected with tunnel junctions. The multiple monolithic laser layers and tunnel junction layers are designed in a way to reduce the stress and to improve the heat dissipation generated by each laser diode and each active area. Temperature variation reduction between multiple active areas, reduce the wavelength differences between the multiple monolithic laser diodes active areas.

It is recommended for the tunnel junctions (14, 15), (28, 29) to be thin in order to reduce absorption and losses. The thickness of the tunnel junctions can be 50 nm or less.

Figure 3:
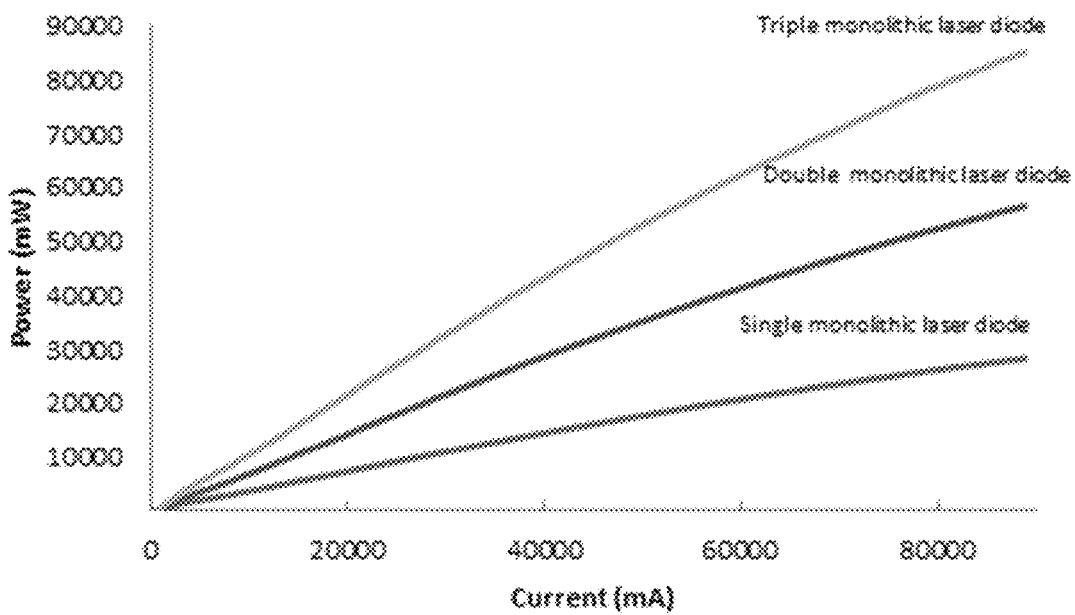
FIG. 3 is a plot of output power in milliWatts as a function of current of single laser diode, double monolithic laser diode and triple monolithic laser diode.

The multiple monolithic semiconductor laser structure using aluminum indium gallium arsenide (AlInGaAs), gallium indium arsenide phosphide (GaInAsP), indium gallium arsenide (InGaAs), indium phosphide (InP), (AlGaInAs/GaInAsP/InGaAs/InP) material system. Each monolithic laser design, the active area layers, the design of the optical cavity and the design of tunnel junction are preferably optimized to minimize the temperature increase of the active area and to minimize the effects on the laser efficiency. The result is a high output power semiconductor laser for the wavelengths between 1250 nm and 1720 nm, as shown in FIG. 3. The output power of single laser is high; the output power of double monolithic laser is almost double of single laser power. The output power of triple monolithic laser diode is almost triple of single laser power. The same power increase is expected for four or more monolithic laser diode.

The multiple monolithic semiconductor laser structure of FIG. 1 containing multiple monolithic diodes 400, 500, 600, each laser diode containing an active area (100, 200, 300). The active areas (100, 200 and 300) are epitaxially grown between waveguide layers (5, 11, 19, 25, 33, and 39). The waveguide layers (5, 11, 19, 25, 33, and 39) are surrounded by cladding layers (2, 3, 13, 16, 17, 27, 30, 31, 41). The cladding layers are epitaxially grown above and below the waveguide layers and the active areas. Each monolithic laser diode is connected to the subsequent monolithic laser by a tunnel junction (14, 15) and (28, 29).

In this structure, the active area of each monolithic laser diode (100, 200, 300) is a strain compensated multiquantum well structure containing a compressive strained AlGaInAs wells (7, 9, 21, 23, 35, 37) and tensile strained AlGaInAs barrier layers (6, 8, 10, 20, 22, 24, 34, 36, 38). The thickness of the quantum well is 10 nanometers (nm) or less. The width of the well is adjusted to achieve the desired operating wavelength without exceeding the critical thickness.

Each active area of multiple monolithic laser diodes is positioned within the center of an optical confinement layer of either the step index type or the graded index type separate confinement heterostructure (GRINSCH). An InP layer on each side (2, 13), (16, 27), (30, 41) forms the optical cladding layers for the optical confinement structures of each monolithic laser diode (400, 500, 600) and the multiquantum well (MQW) active layer (100, 200, 300). Lateral optical confinement is provided by either a buried heterostructure or a ridge waveguide structure.

The multiple laser diode active areas (100, 200, 300) contain one, two, three or more quantum AlInGaAs wells surrounded by AlInGaAs barriers. The active areas are centered in P-type and N-type AlInAs/AlInGaAs/InP waveguide. The waveguide layers (5, 11), (19, 25) and (33, 39) are surrounded by AlGaInAs/InP cladding layers (2, 13), (17, 27), (30, 41). Each monolithic laser diode (400, 500, 600) is connected to the next monolithic laser by a tunnel junction InGaAs/InGaAs (14, 15) and (28, 29).

FIG. 1 shows the layer structure of a multiple semiconductor laser used to construct multiple monolithic laser devices as per the present embodiment. The epitaxial structure shown in FIG. 1 is using conventional III-V compound semiconductor epitaxial growth techniques such as metal organic chemical vapor deposition (MOCVD) and molecular beam epitaxy (MBE).

The preferred structure is as follows. The starting substrate 0 is N+-type InP, followed by a 1 microns N+ type InP buffer layer, on to which a 1 micrometer thick N+ InP lower cladding layer with a silicon (Si) doping concentration of 3e18 cm3 maximum is grown followed by a transition region 15 nm thick of lattice matched, graded (Al$_x$Ga(1−x))In0.53As (where $0.5<x<1$) to Al$_{0.48}$In$_{0.52}$As 3-4 into the separate confinement heterostructure (SCH) layers 4-12. Next is the lower graded-index (GRIN) layer 5, which is 45 nm thick beginning with Al$_{0.48}$In$_{0.52}$As and ending with (Al$_x$Ga(1−x))In0.53As (where $0.5<x<1$). The silicon doping concentration gradually decreases starting at 3e18 cm-3 from the n-type lower cladding 2 through the transition layers 3-4 to the lower GRIN layer 5 where the silicon doping reaches 5e16 cm-3.

The undoped laser active area 100 has a set of compressively strained AlGaInAs quantum wells 7 and 9, which are confined on each side by AlGaInAs barrier layers 6,8 and 10 under tensile strain such that the strains compensate each other and the critical thickness for dislocations is neutralized. Here, two quantum wells 7 and 9 are shown each having a well thickness between 5 nm and 10 nm. The barrier layer thicknesses are between 5 nm and 10 nm for layers 6, 8, and 10, respectively.

Next the upper GRIN separate confinement layer (GRIN SCH) 11, which is 40 nm thick beginning with Al$_x$Ga(1−x)In0.53 (where $0.5<x<1$) and ending with an interface layer of Al0.48In0.52As 12, which is grown on top of the laser active area 100. Included in layer 12 is an additional layer of Al0.48In0.52As. The p-type Zn doping concentration is gradually increased from 5e16 cm-3 or less as growth proceeds toward the completion of layer 12. Where the concentration reaches 6e17 cm-3. Alternatively, a step index separate confinement heterostructure (SISCH) could be used in place of the GRIN SCH as confinement about the active area 100.

Above the GRIN layer 11-12 is grown the upper cladding layer 13 of thick p-type InP Zn-doped at a concentration starting at 1e17 cm-3. The layers 11, 12 and 13 mirror the lower layers of 3, 4 and 5 in optical index profile and form the bottommost monolithic laser diode 400.

Above the upper cladding layer 13 of the bottommost monolithic laser diode 400, the tunnel junction layers 14, 15 are grown. Layer 14 is 25 nm+100%/−75% InGaAs p-doped with Zinc or Carbon at concentration of 1e19 cm-3. The P-InGaAs concentration could be any value between 5e18 cm-3 and 1e20 cm-3. Layer 15 is 25 nm+100%/−75% InGaAs N-doped with Silicon or Tellerium at concentration of 1e19 cm-3. The P-InGaAs concentration could be any value between 5e18 cm-3 and 1e20 cm-3.

Above the tunnel junction N-InGaAs layer 15, the second monolithic laser 500 is grown starting 1.5 micrometer thick N+ InP lower cladding layer 16 with a silicon (Si) doping concentration of 3e18 cm-3 maximum is grown followed by a transition region 15 nm thick of lattice matched, graded $Al_xGa_{(1-x)}In_{0.53}As$ (where $0.5<x<1$) to $Al_{0.48}In_{0.52}As$ 17-18 into the separate confinement heterostructure (SCH) layers 18-26. Next is the lower graded-index (GRIN) layer 19, which is 45 nm thick beginning with $Al_{0.48}In_{0.52}As$ and ending with $Al_xGa_{(1-x)}In_{0.53}As$ (where $0.5<x<1$). The silicon doping concentration gradually decreases from the n-type lower cladding 16 through the transition layers 17-18 to the lower GRIN layer 19, where the silicon doping reaches 5e16 cm-3.

The undoped laser active area 200 has a set of compressively strained AlGaInAs quantum wells 21 and 23, which are confined on each side by AlGaInAs barrier layers 20, 22 and 24 under tensile strain such that the strains compensate each other. Here, two quantum wells 21 and 23 are shown each having a well thickness between 5 nm and 10 nm. The barrier layers thicknesses are between 5 nm and 10 nm for layers 20, 22, and 24, respectively.

Next the upper GRIN separate confinement layer (GRIN SCH) 25, which is 40 nm thick beginning with $Al_xGa_{(1-x)}In_{0.53}$ (where $0.5<x<1$) and ending with an interface layer of $Al_{0.48}In_{0.52}As$ 26, which is grown on top of the laser active area 200. Included in layer 26 is an additional layer of $Al_{0.48}In_{0.52}As$. The p-type Zn doping concentration is gradually increased as growth start 5e16 cm-3 or less proceeds toward the completion of layer 26, where the concentration reaches 6e17 cm-3. Alternatively, a step index separate confinement heterostructure (SISCH) could be used in place of the GRIN SCH as confinement about the active area 200.

Above the GRIN layer 25-26 is grown the upper cladding layer 27 of 1.5 micrometer thick p-type InP Zn-doped at a concentration starting at 1e17 cm-3. The layers 25, 26, and 27 mirror the lower layers of 17, 18 and 19 in optical index profile and form the second monolithic laser diode 500 about the active area 200.

Above the upper cladding layer 27 of the second monolithic laser diode 500, the tunnel junction layers 28, 29 are grown. Layer 28 is 25 nm+100%/0/−75% InGaAs p-doped with Zinc or Carbon at concentration of 1e19 cm-3. The P-InGaAs concentration could be any value between 5e18 cm-3 and 1e20 cm3. Layer 29 is 25 nm+100%/−50% InGaAs N-doped with Silicon or Tellurium at concentration of 1e19 cm-3. The P-InGaAs concentration could be any value between 5e18 cm-3 and 1e 20 cm-3.

Above the tunnel junction N-InGaAs layer, the third monolithic laser 600 is grown starting 1.5 micrometer thick N+ InP lower cladding layer 30 with a silicon (Si) doping concentration of 3e18 cm-3 maximum is grown followed by a transition region 15 nm thick of lattice matched, graded $Al_xGa_{(1-x)}In_{0.53}As$ (where $0.5<x<1$) to $Al_{0.48}In_{0.52}As$ 31-32 into the separate confinement heterostructure (SCH) layers 32-40. Next is the lower graded-index (GRIN) layer 33, which is 45 nm thick beginning with $Al_{0.48}In_{0.52}As$ and ending with $Al_xGa_{(1-x)}In_{0.53}As$ (where $0.5<x<1$). The silicon doping concentration gradually decreases from the n-type lower cladding 30 through the transition layers 31-32 to the lower GRIN layer 33, where the silicon doping reaches 5e16 cm-3.

The undoped laser active area 300 has a set of compressively strained AlGaInAs quantum wells 35 and 37, which are confined on each side by AlGaInAs barrier layers 34, 36 and 38 under tensile strain such that the strains compensate each other. Here, two quantum wells 35 and 37 are shown each having a well thickness between 5 nm and 10 nm. The barrier layers thicknesses are between 5 nm and 10 nm for layers 34, 36, and 38, respectively.

Next the upper GRIN separate confinement layer (GRIN SCH) 39, which is 40 nm thick beginning with $Al_xGa_{(1-x)}In_{0.53}$ (where $0.5<x<1$) and ending with an interface layer 40 of $Al_{0.48}In_{0.52}As$, which is grown on top of the laser active area 300. Included in layer 40 is an additional layer of $Al_{0.48}In_{0.52}As$. The p-type Zn doping concentration is gradually increased as growth proceeds toward the completion of layer 40, where the concentration reaches 6e17 cm-3. Alternatively, a step index separate confinement heterostructure (SISCH) could be used in place of the GRIN SCH as confinement about the active area 300.

Above the GRIN layer 39-40 is grown the upper cladding layer 41 of 1.5 micrometer thick p-type InP Zn-doped at a concentration starting at 1e17 cm-3 and preferably no more than 6e17 cm-3. The layers 39, 40, and 41 mirror the lower layers of 31, 32 and 33 in optical index profile and form the topmost monolithic laser diode 600 about the active area 300.

Above the upper cladding layer 41 are the p-ohmic contact layers 43-46. Between the cladding layer 41 and the contact layers 43-46, a 20 nm thick etch stop layer 42 of $p\text{-}Ga_xIn_{(1-x)}As_yP_{(1-y)}$ (where $0.1<x<0.5$ and $0.2<y<0.8$) is grown in order to provide a controlled stopping depth for etching the ridge waveguide during the laser processing. The etch stop layer could be located at any position between the P-waveguide layer 39 and the p-ohmic contact layers 43-46. Next a 1 micrometer thick p-InP layer 43 Zn-doped is grown followed by a p-type GaInAsP layer 44 Zn-doped and followed by InGaAs layer 45, which will be the ohmic contact layer during laser processing. Finally, a capping layer of p-InP layer 46 Zn doped is grown to complete the laser layer structure.

The detailed doping levels described are the preferred levels, but a range from 25% less to 50% more would be acceptable. The layer with doping higher than 1e18 cm-3 can range higher by factor of two or three as an acceptable range.

The layer thicknesses set forth above are the preferred embodiment, but a variation or 10% more or less is acceptable.

The P-doping in the single monolithic laser diode is Zinc. Here, the probability that the zinc diffuse in the active area is high because of the multiple monolithic laser structure MOCVD growth time is long and growth MOCVD temperature is high. The Zinc diffusion in the active area causes wavelength shifts to lower wavelengths of the laser diode emission.

Zinc doping is modified in layers 11, 12 of bottommost monolithic laser diode in order to reduce and control the zinc diffusion in the active area 100. Layers 11 and 12 zinc doping concentration is less than 1e17 cm-3.

Zinc doping is modified in layers 25, 26 of second monolithic laser diode in order to reduce and control the zinc diffusion in the active area 200. Layers 25 and 26 zinc doping concentration is less than 1e17 cm-3.

The tunnel junction P-InGaAs/N-InGaAs thickness is very thin such as 50 nm in order to eliminate the absorption losses in tunnel junction.

The current spreading in multiple monolithic laser diodes is reduced by reducing the number of epitaxial layers. Except for the top monolithic laser, many layers are removed from the other monolithic laser diodes and some of these layers are thick layers. Removing thick layers reduce the current spreading in the multiple active areas 100, 200, 300 of the multiple laser diodes 400, 500, 600.

The device is preferably with the vertical current injection type semiconductor layers of the SCH and cladding doped p-type, and the other set of the SCH and cladding doped n-type. Lateral current confinement is achieved by either buried stripe geometry, or a ridge waveguide of raised ridge or dual trench formation. An alternative combination is implant isolation, or mesa isolation, whereby oxide depositions confine the current to the central region of the lateral optical confinement structure.

Figure 4:
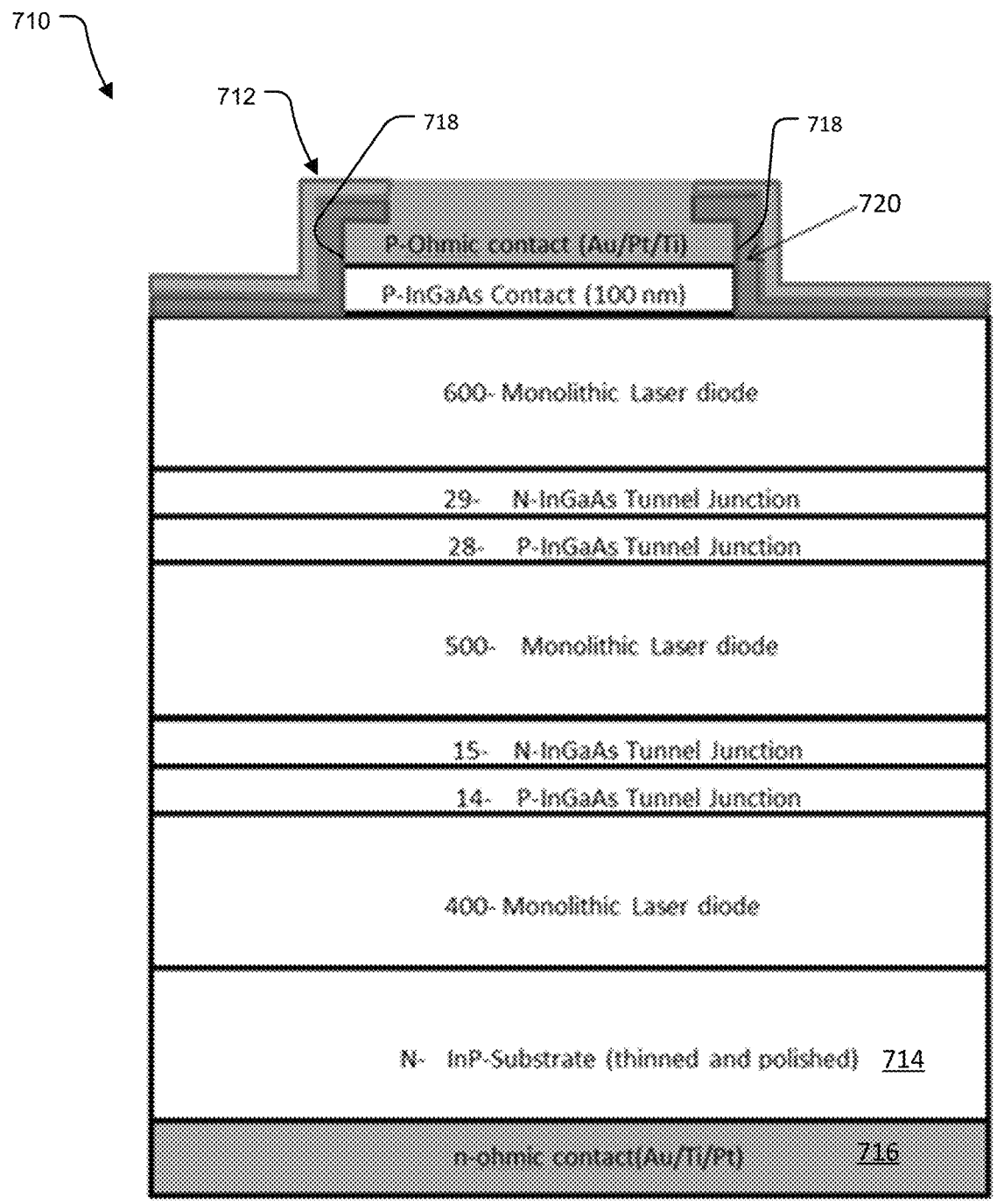
FIG. 4 is a schematic side cross sectional view showing a processed laser chip with a multiple monolithic laser diode structure with its ridge waveguide.

FIG. 4 shows the processed chip 710 for the multiple monolithic laser structure 700, which is fabricated from the epitaxial grown wafer using the structure shown in FIG. 1. The processed multiple monolithic laser chip 700 is a ridge waveguide type laser with a ridge structure 712, with monolithic laser diodes and tunnel junctions. Each monolithic laser diode contains an index guided lateral waveguide confinement structure.

The ridge structure 712 is preferably etched through the active layer forming current confinement structure. The lateral plan of the ridge waveguide structure supports multimode optical operation. The backside of the n-type InP substrate 714 is thinned using grinding and polishing procedures in order to reduce the ohmic series resistance and the ohmic heating of the substrate. The n-type ohmic contact 716 is formed on the backside of the thinned substrate 714.

Figure 5:
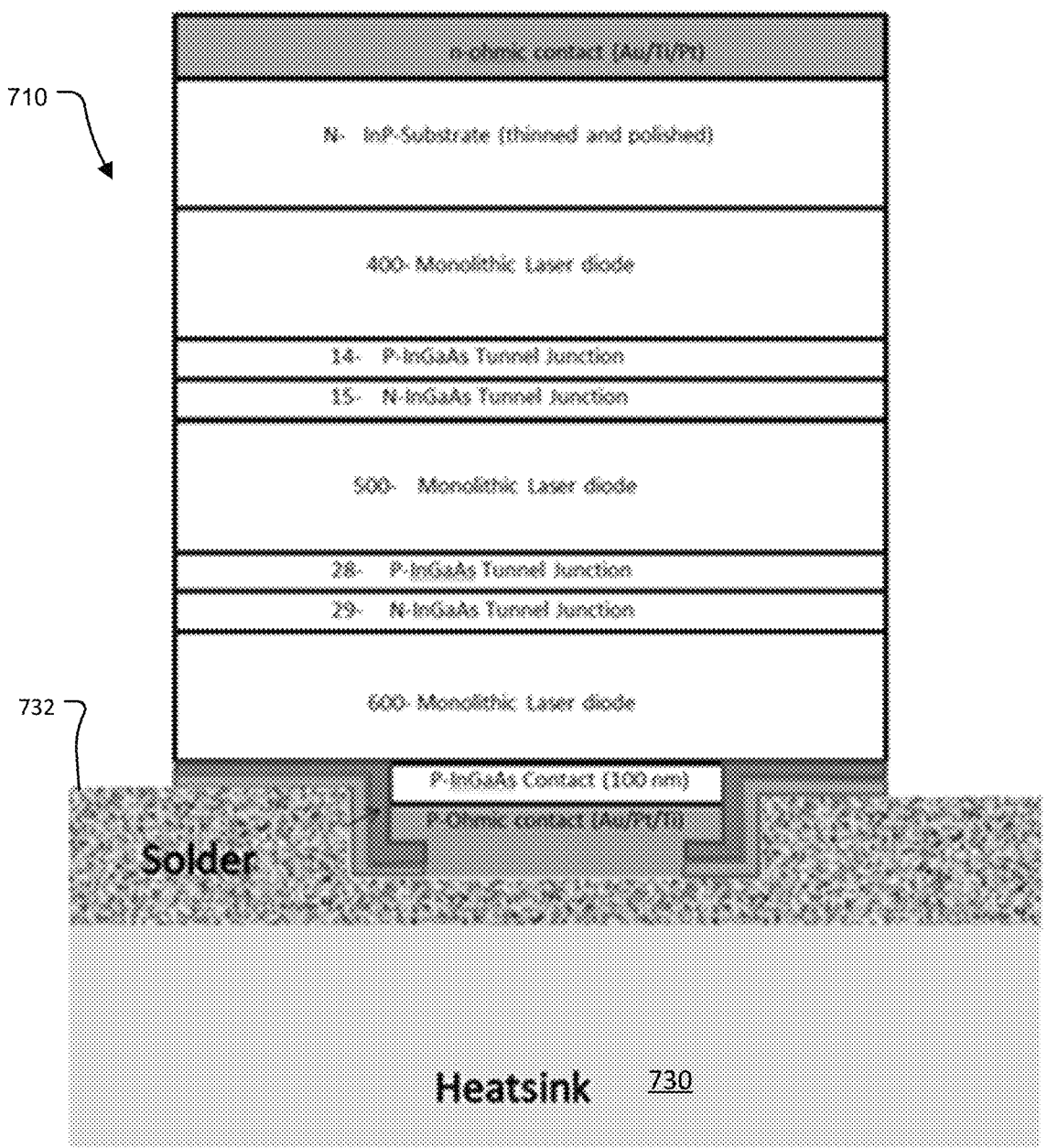
FIG. 5 is schematic side cross sectional view showing a package laser chip mounted on copper heatsink using thin and low temperature solder.

The ridge sidewalls 718 and the top surface of the device wafer are coated with an insulator layer 720 such as SiO2. The SiO2 insulator layer 720 avoids shorting out the junction and confine the current to pass through the active area under the ridge after the device is mounted p-side down, as shown in FIG. 5. The thinned multiple monolithic laser chip 710, after die separation and facet cleaving using standard processes in the semiconductor industry, is attached to a copper heat sink 730 using a low temperature solder 732 to form the multiple monolithic device shown in FIG. 5. This mounting configuration combined with the multiple monolithic laser optimized design results in a low device temperature in the active areas 100, 200, 300, enabling increased laser output power at higher current densities.

In this embodiment, the multiple monolithic laser chips 710 can be mounted p-side up on the heatsink 730 in short electrical pulse conditions between 1 ns and 100 ns. This mounting configuration combined with the multiple monolithic laser optimized design and short electrical pulse condition results in a low device temperature in the active areas 100, 200, 300, enabling increased laser output power at higher current densities.

In one example, the multiple monolithic lasers are processed as a multi-channel bar; each channel corresponds to a single emitter. The number of emitters is between 2 and 19 emitters. The channels are separated electrically and optically from each other's. In this case, each channel can be operated individually as required for some LIDAR and vision applications. The separation between channels is achieved by a deep groove etch from the p-ohmic InGaAs contact through the active areas 100, 200, 300. The groove depth is between 3 microns and 15 microns and the groove side wall angles are between 45 degrees and 82 degrees.

In another example, the multiple monolithic lasers are processed as multichannel bars without any electrical separation between channels. Each bar contains 2 to 19 single emitter and all emitters can be operated at the same time, all together as required for some high power laser applications.

The multiple monolithic laser chip cavity is between front facet mirror and back facet mirror created by cleaving processes. The cavity length of the multiple monolithic laser chips is between 0.5 and 4.0 millimeters. The laser chip aperture width is between 50 and 350 micrometers. These device parameter ranges optimize the laser for good thermal and electrical efficiency by spreading out the electron injection and thermal dissipation over a large area.

While this invention has been particularly shown and described with references to preferred embodiments thereof, it will be understood by those skilled in the art that various changes in form and details may be made therein without departing from the scope of the invention encompassed by the appended claims.

What is claimed is:

1. An edge emitting semiconductor laser containing multiple monolithic laser diodes, using aluminum indium gallium arsenide phosphide AlInGaAs/InGaAsP/InP material system, emitting in long wavelengths (1250 nm to 1720 nm), wherein
   the monolithic laser diodes are connected one to another by one or more tunnel junctions; and
   each monolithic laser diode comprises an active region with barriers and no more than three quantum wells constructed from various ratios of aluminum, gallium, indium and arsenic.

2. The device as claimed in 1, wherein the Aluminum Indium gallium Arsenide quantum wells being sized between 5 nm and 10 nm, wherein the active region is placed between two confining layers of opposite conductive doping where p-doped confining layers start with a concentration of 5e16 cm-3 −25%/+50% and increase to a final concentration of 1e17 cm-3, −25%+50%, and an interface layer that immediately follows the p-doped confining layers has a fixed doping concentration which is between the final doping concentration of the confining layers and 1e18 cm-3, +300%.

3. The device as claimed in claim 1, further comprising an InP substrate and cladding layers in each monolithic laser diode with doping concentrations between 1e17 cm-3 and 6e17 cm-3.

4. The device as claimed in claim 3, wherein the p-doped cladding layer of each monolithic laser diode is doped with zinc.

5. The device as claimed in claim 3, wherein each monolithic laser diode comprising an aluminum indium arsenide layer between the active region and at least one of the cladding layers.

6. The device as claimed in claim 3, wherein the doping of the aluminum indium arsenide layer in each monolithic laser diode is zinc and its concentration is equal or less than 1e18 cm-3.

7. The device as claimed in claim 1, wherein the number of the monolithic laser diodes is two, three or four and each monolithic laser diode contains graded index confining layers.

8. The device as claimed in claim 1, wherein a P-type aluminum indium gallium arsenide waveguide layer is equal or less than 1e17 cm-3, in one or two or all monolithic laser diodes.

9. The device as claimed in claim 1, wherein a P-type aluminum indium gallium arsenide cladding layer doping concentration is equal or less than 1e18 cm-3 for one, two or all monolithic laser diodes.

10. The device as claimed in claim 1, wherein an N-type aluminum indium gallium arsenide waveguide layer doping concentration is equal or less than 1e17 cm-3 for one, two or all monolithic laser diodes.

11. The device as claimed in claim 1, wherein an N-type aluminum indium gallium arsenide cladding layers doping is equal or less than 5e17 cm-3, in one, two or all monolithic laser diodes.

12. The device as claimed in claim 1, comprising a ridge waveguide structure on the top monolithic laser that supports multiple spatial modes in each monolithic laser diode.

13. The device as claimed in claim 1, comprising a groove etched from the top p-type indium gallium arsenide contact layer through the active area.

14. The device as claimed in claim 13, wherein the depth of the groove is between 2 micrometers and 10 micrometer and walls forming the groove are tilted at an angle between 45 degrees and 80 degrees.

15. The device as claimed in claim 1, with aperture width is between 2 and 350 micrometer and the cavity length is between 0.5 mm and 4 mm.

16. The device as claimed in claim 1, wherein light emits in the spectral range of 1250 micrometers and 1720 micrometers.

17. An edge emitting semiconductor laser grown on indium phosphide substrate containing multiple monolithic laser diodes, in which the monolithic laser diodes are connected to each other with a tunnel junction, wherein each monolithic laser diode comprises an active region with barriers and quantum wells constructed from various ratios of aluminum, gallium, indium and arsenic wherein the quantum well structures of the multiple active areas differ from one to another in terms of their layer thicknesses and/or their material compositions such that at least two emission areas have different emission wavelengths by at least 5 nm.

18. An edge emitting semiconductor laser grown on indium phosphide substrate containing multiple monolithic laser diodes, in which the monolithic laser diodes are connected to each other with a tunnel junction, wherein each monolithic laser diode comprises an active region with barriers and quantum wells constructed from various ratios of aluminum, gallium, indium and arsenic wherein the quantum well structures of the multiple active areas are the same or differ from one to another in terms of their layer thicknesses and/or their material compositions such that all emission areas have the same emission wavelengths within 5 nm.

19. The device as claimed in claim 18, wherein the photoluminescence emission difference between one monolithic laser diode to another one is less than 5 nm.

20. The device as claimed in claim 18, wherein each monolithic laser diode compromise aluminum indium gallium arsenide barriers with thicknesses between 5 nanometers and 10 nanometers.

21. The device as claimed in claim 18, wherein the monolithic laser diodes are connected to one another by tunnel junctions and the tunnel junctions have a thickness of 50 nm or less.

22. The device as claimed in claim 18, wherein the tunnel junction comprising two indium gallium arsenide layers, P-type and N-type.

23. The device as claimed in claim 18, wherein the tunnel junction P-type indium gallium arsenide layer is doped with Carbon or Zinc with doping concentration higher than 5e18 cm-3 and less than 1e20 cm-3.

24. The device as claimed in claim 18, wherein the tunnel junction N-type indium gallium arsenide layer is doped with Silicon or Tellerium with doping concentration higher than 5e18 cm-3 and less than 1e20 cm-3.

25. The device as claimed in claim 18, wherein the tunnel junction P-type indium gallium arsenide layer thickness is less than 50 nm and N-type indium gallium arsenide layer thickness is less than 50 nm.

* * * * *